(12) United States Patent
Katti et al.

(10) Patent No.: US 12,721,178 B2
(45) Date of Patent: Aug. 25, 2026

(54) MAGNETIC SHIELDING FOR MAGNETO RESISTIVE MEMORY

(71) Applicant: Honeywell International Inc., Charlotte, NC (US)

(72) Inventors: Romney R. Katti, Shorewood, MN (US); Bryan C. Westberg, Delano, MN (US); Gerald Budach, Andover, MN (US); Alissa Krynski, Maple Grove, MN (US)

(73) Assignee: Honeywell International Inc., Charlotte, NC (US)

( * ) Notice: Subject to any disclaimer, the term of this patent is extended or adjusted under 35 U.S.C. 154(b) by 738 days.

(21) Appl. No.: 18/295,518

(22) Filed: Apr. 4, 2023

(65) Prior Publication Data

US 2024/0339417 A1 Oct. 10, 2024

(51) Int. Cl.

| | |
|---|---|
| ***H10W 42/20*** | (2026.01) |
| ***H10B 61/00*** | (2023.01) |
| ***H10B 80/00*** | (2023.01) |
| ***H10N 50/10*** | (2023.01) |
| ***H10W 90/00*** | (2026.01) |
| *G11C 11/16* | (2006.01) |

(52) U.S. Cl.

CPC ............ *H10W 42/20* (2026.01); *H10B 61/00* (2023.02); *H10B 80/00* (2023.02); *H10N 50/10* (2023.02); *H10W 90/00* (2026.01); *G11C 11/1673* (2013.01); *G11C 11/1675* (2013.01)

(58) Field of Classification Search

None

See application file for complete search history.

(56) References Cited

U.S. PATENT DOCUMENTS

| | | | |
|---|---|---|---|
| 7,336,556 | B2 | 2/2008 | Okayama et al. |
| 8,792,208 | B1 | 7/2014 | Liu et al. |
| 9,172,028 | B2 | 10/2015 | Watanabe et al. |
| 9,553,052 | B2 | 1/2017 | Matsubara et al. |
| 10,261,138 | B2 | 4/2019 | Marauska et al. |

(Continued)

FOREIGN PATENT DOCUMENTS

| | | | |
|---|---|---|---|
| JP | 2005011860 | A | 1/2005 |
| KR | 100313988 | B1 | 1/2002 |
| WO | 2016174509 | A1 | 11/2016 |

OTHER PUBLICATIONS

Response to Office Action dated Jul. 20, 2023 from U.S. Appl. No. 17/305,755, filed Oct. 18, 2023, 9 pp.

(Continued)

*Primary Examiner* — Hung K Vu

(74) *Attorney, Agent, or Firm* — Shumaker & Sieffert, P.A.

(57) ABSTRACT

An example apparatus includes a magnetic device, top magnetic shielding, bottom magnetic shielding, and a plurality of side magnetic shielding elements. The top magnetic shielding includes a first magnetic material. The bottom magnetic shielding includes a second magnetic material. Each side magnetic shielding element of the plurality of side magnetic shielding elements includes a third magnetic material. Each one of the plurality of side magnetic shielding elements extend at least partially between the top surface of the magnetic device and the bottom surface of the magnetic device. The plurality of side magnetic shielding elements only partially extends over a first side surface.

20 Claims, 10 Drawing Sheets

(56) References Cited

U.S. PATENT DOCUMENTS

| | | | | |
|---|---|---|---|---|
| 10,453,801 | B2 | 10/2019 | Seo et al. | |
| 10,510,946 | B2 | 12/2019 | Bhushan et al. | |
| 2004/0165320 | A1 | 8/2004 | Carey et al. | |
| 2005/0059170 | A1 | 3/2005 | Min et al. | |
| 2008/0122047 | A1 | 5/2008 | Honer et al. | |
| 2012/0287708 | A1 | 11/2012 | Katti | |
| 2013/0250662 | A1 | 9/2013 | Katti et al. | |
| 2015/0069545 | A1* | 3/2015 | Noma | H01L 23/552 257/421 |
| 2015/0179192 | A1 | 6/2015 | Narayana | |
| 2016/0284761 | A1 | 9/2016 | Zhou et al. | |
| 2019/0279698 | A1 | 9/2019 | Ohmori et al. | |
| 2023/0014296 | A1* | 1/2023 | Katti | H10B 61/00 |

OTHER PUBLICATIONS

Office Action from U.S. Appl. No. 17/305,755 dated Nov. 21, 2024, 24 pp.

Advisory Action from U.S. Appl. No. 17/305,755 dated Apr. 11, 2024, 15 pp.

Response to Final Office Action dated Feb. 1, 2024 from U.S. Appl. No. 17/305,755, filed Mar. 21, 2024, 11 pp.

Response to Office Action dated Nov. 21, 2024 from U.S. Appl. No. 17/305,755, filed Feb. 21, 2025, 10 pp.

Office Action from U.S. Appl. No. 17/305,755 dated Jul. 20, 2023, 15 pp.

Relevent Section of Asai in English, from JP2005011860 published Jan. 13, 2005, 1 pp.

Notice of Allowance from U.S. Appl. No. 17/305,755 dated Jul. 1, 2025, 8 pp.

Final Office Action from U.S. Appl. No. 17/305,755 dated Feb. 1, 2024, 25 pp.

* cited by examiner

100

200

MAGNETIC SHIELDING 210D

MAGNETIC SHIELDING 210B

MAGNETIC SHIELDING 212

MAGNETIC DEVICE 220

MAGNETIC SHIELDING 210C

MAGNETIC SHIELDING 210A

300

MAGNETIC SHIELDING 314A

MAGNETIC SHIELDING 314B

MAGNETIC SHIELDING 312

MAGNETIC DEVICE 320

MAGNETIC SHIELDING 310A

MAGNETIC SHIELDING 310B

400

MAGNETIC SHIELDING FOR MAGNETO RESISTIVE MEMORY

STATEMENT REGARDING FEDERALLY SPONSORED RESEARCH OR DEVELOPMENT

This invention was made with Government support under FA9453-19-C-0010 awarded by AF Research Laboratory. The Government has certain rights in the invention.

TECHNICAL FIELD

This disclosure relates to memory devices and, more specifically, to magnetic devices.

BACKGROUND

Most modern electronic devices include a power source, components for storing data, components for processing data, components for receiving user input, and components for delivering user output. It is desirable for such electronic devices to have long battery life, powerful processing capabilities, and large amounts of data storage, but at the same time, it is also desirable for electronic devices to maintain small and lightweight form factors. To meet these conflicting demands, it is desirable for the components of these devices to become smaller with better performance.

It is generally desirable for memory components, for example, to store more data in a smaller space with faster read and write operations. Current types of non-volatile memory include electro-mechanical hard drives where read/write heads read and write data from and to a series of rotating disks. Other types of non-volatile memory include solid state memories that use transistors and other devices (e.g., capacitors, floating gate MOSFETs, etc.) to store data without any moving parts and with faster read and write access.

SUMMARY

This disclosure generally describes techniques for magnetic shielding for perpendicularly oriented magnetic devices (e.g., magnetic devices using a magnetic field that is perpendicular to a plane of a package or chip of the magnetic device). Magnetic devices may include, for example, a memory device comprising a magneto-resistive random access memory (MRAM), such as, for example, magnetic tunnel junction (MTJ) element and/or spin-torque transfer MRAM (STT-MRAM).

Magnetic shielding may protect magnetic devices, such as magnetic memory devices, from external or stray magnetic fields. For example, plates of magnetic material may be placed on a top and a bottom of a single chip package or a multi-chip module to help prevent the external or stray magnetic fields from altering in-plane magnetization of magnetic devices. As used herein, in-plane magnetization comprises magnetization parallel with a plane formed by the top and bottom magnetic shields. For example, a magnetic memory device may store a bit based on whether a magnetic field is directed in a positive horizontal direction (e.g., x) or a negative horizontal direction (e.g., −x), where the magnetic shielding extends along the horizontal direction (e.g., x) and a depth dimension (e.g., y). Pin connections may extend from the side (e.g., extending along the x direction) of the single chip package or a multi-chip module. In this example, the top of the chip (e.g., maximum z value) is the top magnetic shield and the bottom of the chip (e.g., minimum z value) is the bottom magnetic shield.

Memory devices may be sensitive to perpendicular magnetization (e.g., along a z axis). Such magnetization may not be mitigated by a top magnetic plate and a bottom magnetic plate. As such, techniques described herein may include magnetic shielding to help prevent external or stray magnetic fields from altering perpendicular magnetization of magnetic devices. For example, a device may include magnetic shielding (e.g., a rectangular plate or a columnar structure) that extends along the z-axis. The magnetic shielding may be oriented to extend more along the z-axis than the x and y axes or may be oriented to extend more along the x-axis than the y and z axes. Moreover, forming voids of magnetic shielding may help to improve a shielding of the magnetic shields, which may further prevent external or stray magnetic fields from altering perpendicular magnetization of magnetic devices.

In one example, an apparatus includes: a magnetic device; top magnetic shielding comprising a first magnetic material, the top magnetic shielding extending over a top surface of the magnetic device at least partially between a first side surface of the magnetic device and a second side surface of the magnetic device, wherein the first side surface is on an opposite side of the magnetic device from the second side surface of the magnetic device; bottom magnetic shielding comprising a second magnetic material, the bottom magnetic shielding extending over a bottom surface of the magnetic device at least partially between the first side surface of the magnetic device and the second side surface of the magnetic device; and a plurality of side magnetic shielding elements, each side magnetic shielding element of the plurality of side magnetic shielding elements comprising a third magnetic material, each one of the plurality of side magnetic shielding elements extending at least partially between the top surface of the magnetic device and the bottom surface of the magnetic device, wherein the plurality of side magnetic shielding elements forms a void of the third magnetic material that exposes the first side surface.

In another example, a chip package includes: a magnetic device; top magnetic shielding comprising a first magnetic material, the top magnetic shielding extending over a top surface of the magnetic device at least partially between a first side surface of the magnetic device and a second side surface of the magnetic device, wherein the first side surface is on an opposite side of the magnetic device from the second side surface of the magnetic device; bottom magnetic shielding comprising a second magnetic material, the bottom magnetic shielding extending over a bottom surface of the magnetic device at least partially between the first side surface of the magnetic device and the second side surface of the magnetic device; a plurality of side magnetic shielding elements, each side magnetic shielding element comprising a third magnetic material, each one of the plurality of side magnetic shielding elements extending at least partially between the top surface of the magnetic device and the bottom surface of the magnetic device, wherein the plurality of side magnetic shielding elements only partially extend over the first side surface; and one or more pins, each pin of the one or more pins being electrically coupled to the magnetic device and extending from a third side surface of the magnetic device and/or a fourth side surface of the magnetic device, wherein the plurality of side magnetic shielding elements forms a void of the third magnetic material that exposes the first side surface.

In one example, an apparatus includes: a magnetic device comprising magneto-resistive random access memories (MRAMs), each MRAM of the MRAMs being configured to store data based on a perpendicular magnetization; top magnetic shielding comprising a first magnetic material, the top magnetic shielding extending over a top surface of the magnetic device at least partially between a first side surface of the magnetic device and a second side surface of the magnetic device, wherein the first side surface is on an opposite side of the magnetic device from the second side surface of the magnetic device; bottom magnetic shielding comprising a second magnetic material, the bottom magnetic shielding extending over a bottom surface of the magnetic device at least partially between the first side surface of the magnetic device and the second side surface of the magnetic device; and a plurality of side magnetic shielding elements, each side magnetic shielding element comprising a third magnetic material, each one of the plurality of side magnetic shielding elements extending at least partially between the top surface of the magnetic device and the bottom surface of the magnetic device, wherein the plurality of side magnetic shielding elements forms a void of the third magnetic material that exposes the first side surface.

The details of one or more aspects of the disclosure are set forth in the accompanying drawings and the description below. Other features, objects, and advantages of the devices, systems, methods, and techniques described in this disclosure will be apparent from the description and drawings, and from the claims.

DETAILED DESCRIPTION

Figure 1A:
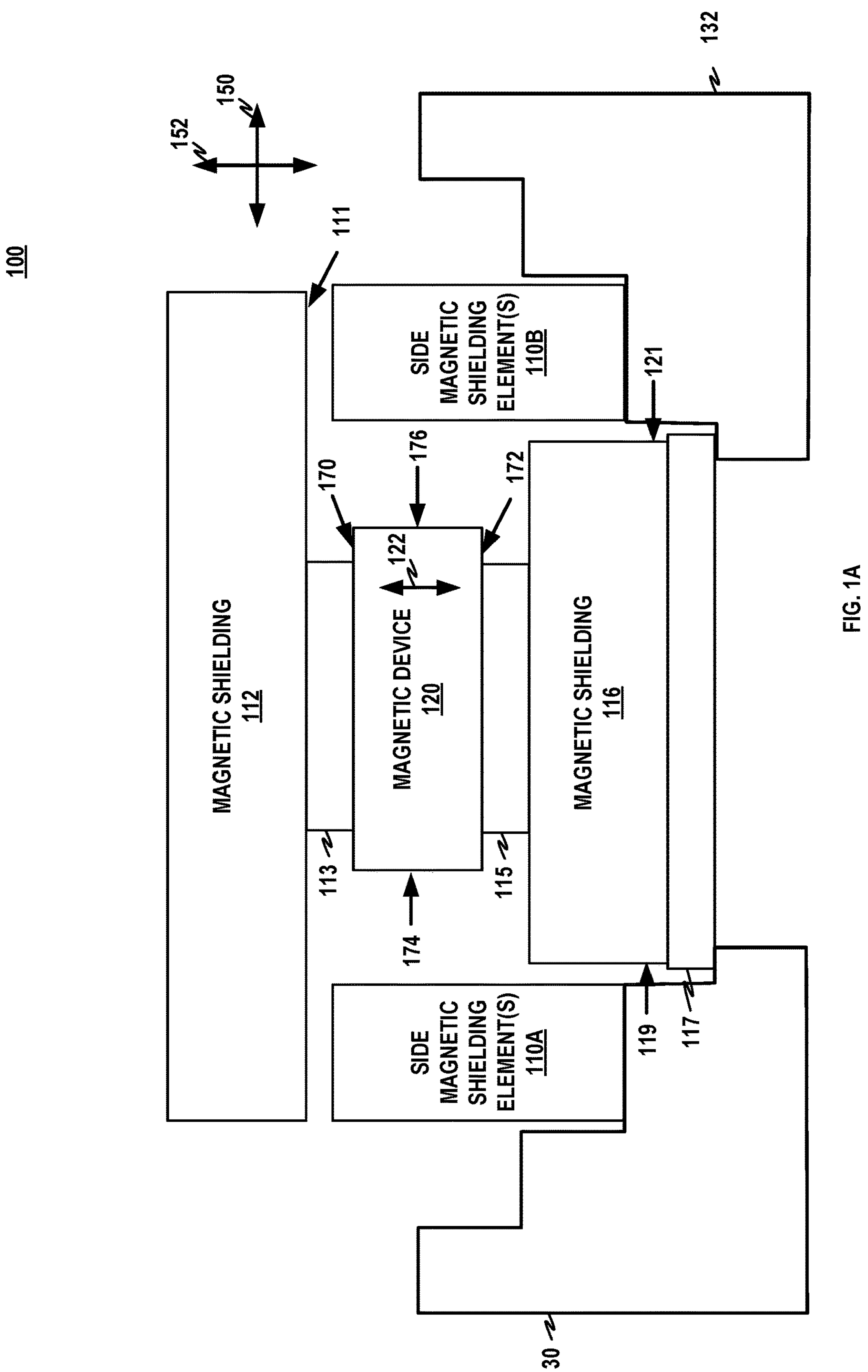
FIG. 1A shows a conceptual illustration of a first example of magnetic shielding of a magnetic device in a two-dimensional x-z plane view, in accordance with the techniques of the disclosure.

Some applications have been identified in which memory devices, memory components/parts, and architectures may need to be radiation-hardened, offer non-volatility, and/or include magnetically-based devices that can be integrated monolithically or in multi-chip modules. Magneto-Resistive Random Access Memory (MRAM) is robust, has high endurance, has high data retention performance, and is scalable. These characteristics can be tailored for applications. Magnetic/spintronic memory devices are expected to provide desired non-volatile (and volatile) memory and data storage characteristics; including providing scalability, high endurance, and high data retention performance. These characteristics can be optimized for applications. Magnetic/spintronic memory devices may offer materials and technological similarity and compatibility with MRAM bits and other sensing devices such as accelerometers, gyros, and pressure sensors, which may support integration, modularity, miniaturization, and packaging with embedded MRAM and application specific integrated circuits (ASICs).

MRAMs may be used to store and access data with non-volatility for computing and data system applications. Magnetic devices may represent elements within MRAMs that are written, accessed, and used to store information with non-volatility. Incorrect operation of magnetic devices and MRAMs can be induced by external or stray magnetic fields of sufficient magnitude and direction. Magnetic shielding may be used to protect magnetic devices to facilitate and maintain correct MRAM operation. Because MRAMs may be used and anticipated for use in diverse environments that may include stray magnetic fields, MRAMs may benefit from magnetic shielding when handling and deployment of MRAMs may be subject to external or stray magnetic field exposure. In particular, magnetic devices, e.g., Magnetic Tunnel Junctions (MTJs) exhibiting and using perpendicular magnetization and spin-transfer torque (STT) and magneto-resistive effects can be adversely affected by excessive stray magnetic fields, and so magnetic shielding may be used to protect STT-MRAMs in such circumstances. While some techniques for providing magnetic shielding for MRAMs with magnetic devices with in-plane magnetization, magnetic shielding for MRAMs, including STT-MRAMs, with magnetic devices with out-of-plane, or perpendicular, magnetization.

Magnetic shielding may protect magnetic devices that could experience magnetic state changes from external/stray magnetic fields. For example, a magnetic shield may shunt magnetic field(s) from active magnetic layers of a magnetic device. Magnetic shielding for protecting in-plane magnetic devices may not be applicable for magnetically shielding out-of-plane, or perpendicular magnetization in an operational magnetic device layer, for magnetic devices. For example, magnetic shielding for only "in-plane magnetization in an operational magnetic device layer" magnetic devices such as in MRAMs may not protect magnetic devices that operate using out-of-plane magnetization in environments where external or stray magnetic fields could exceed the critical field limit of the magnetic devices. For instance, magnetic fields from the environment may flow through the magnetic shielding and alter data bits in an MRAM. Examples of an MRAM may include a STT-MRAMs that use a perpendicularly-oriented MTJ devices as the magnetic data bits and other device structures. A magnetic memory device (e.g., MRAM bit cell and/or MTJ element) may be configured to use spin-dependent diffusion, spin-orbit coupling, and spin transfer to write to a free structure (FL/FL) structure and/or may be configured to use an MTJ element (with tunneling magneto resistive (TMR)

sensing, or alternatively, giant magneto-resistive (GMR) sensing or anisotropic magneto-resistive (AMR) sensing) structure for read-back.

MRAMs may use magnetic shielding to protect magnetic elements, including magnetic bits, magnetic devices, and magnetic structures, from adverse effects from exposure to excessive stray magnetic fields (SMFs). Magnetic shielding may be used to maintain desired non-volatile memory operation and data integrity over the specified life of the part over specified conditions. Customer handling and application requirements motivate implementing magnetic shielding in MRAMs including Toggle-bit and STT (Spin-Transfer Torque) MRAMs for robust operation in critical applications.

First-generation Toggle-bit MRAMs may use in-plane Magnetic Tunnel Junction (MTJ) bits for information storage and retrieval, MTJ devices for memory operation, and additional magnetic structures for supporting the write process. Magnetic shielding may be included to protect these magnetic elements from adverse effects. Second-generation STT-MRAMs may be used in commercial applications and may be magnetically unshielded. Magnetically unshielded STT-MRAMs may have a higher SMF disturb threshold than magnetically unshielded Toggle-bit MRAMs, but a lower SMF disturb threshold than magnetically shielded Toggle-bit MRAMs. Magnetically unshielded STT-MRAMs may have SMF disturb thresholds that are less than desirable for environments with stray magnetic fields.

The approach described here provides competitive advantage from first-generation Toggle-bit MRAM given the added capability of z-axis SMF attenuation in addition to x-axis and y-axis SMF attenuation. This approach may help to allow SMF protection for all three geometric axes (x, y, and z) for MRAMs, including STT-MRAMs. Magnetic shielding geometries, materials, and configurations are defined herein which protect MRAMs including STT-MRAMs from excessive external SMFs. The magnetic shielding geometries, materials, and configurations may provide magnetic shielding around the MRAM die, e.g., on the sides of the MRAM die in addition to above and beneath the MRAM die, for example, making use of wirebond shelves, corners, cavity floor, and lid seal structures and accounting for wire bonding needs such as die pads, package pads, and package connections. The magnetic shielding geometries, materials, and configurations may protect against in-plane (x-axis and y-axis) and perpendicular (z-axis) SMFs. The magnetic shielding geometries, materials, and configurations may provide shunting and attenuation of SMFs away from the magnetic elements in MRAMs including STT-MRAMs. And/or may be applied to existing and future packages. Techniques described herein may apply to leaded and grid array packages, for example.

Examples described herein may include geometries and processes that are suitable for providing magnetic shielding for MRAMs including STT-MRAMs, for MTJ bits, devices, and structures with in-plane and perpendicular magnetization orientations. These techniques can also be applied to Toggle-bit MRAMs in instances where greater attenuation of perpendicular SMFs is needed.

Magnetic shielding examples are described for use with perpendicular magnetic devices. Magnetic shielding configurations with geometries and materials that can be used for magnetically shielding perpendicular magnetic devices. Applying magnetic shielding configurations for only in-plane magnetic devices may not be satisfactory for operating MRAMs. Applying appropriate magnetic shielding (e.g., magnetic shielding for perpendicularly-oriented magnetic structures) can enable using perpendicular magnetic devices to achieve higher memory density, lower power, and lower cost per bit with radiation hardness.

In accordance with one or more techniques described herein, magnetic shielding may be configured to shunt both in-plane and out-of-plane magnetization fields from an environment. For example, techniques may apply magnetic shielding to protect magnetic device(s) with perpendicular magnetization for the MRAM die and parts/products. Technology nodes may include, for example, various node sizes and/or types.

For example, an apparatus (e.g., package or a chip) may include a plurality of side magnetic shielding elements on a sides (e.g., a left or right side) of a magnetic device. Applying magnetic shielding (e.g., magnetic shielding for perpendicularly-oriented magnetic structures) can enable the magnetic device to determine a perpendicular magnetization with minimal or no interference from both in-plane and out-of-plane magnetization fields from an environment, which may help to achieve a higher memory density, lower power, and/or lower cost per bit compared to devices that only shield for in-plane magnetization fields from the environment.

FIG. 1A shows a conceptual illustration of a first example of magnetic shielding of a magnetic device 120 in a two-dimensional x-z plane view, in accordance with the techniques of the disclosure. In the example of FIG. 1A, an apparatus 100 may include magnetic shielding 116, which is also referred to herein as "bottom magnetic shielding", side magnetic shielding elements 110A-110B (collectively, side magnetic shielding elements 110, also referred to herein as a plurality of side magnetic shielding elements 110 or simply magnetic shielding 110) and a magnetic device 120. In the example of FIG. 1A, apparatus 100 may optionally include one or more of preform 113, preform 115, lid seal ring 130, or lid seal ring 132.

Magnetic device 120 may be configured to determine a perpendicular magnetization 122 that extends along a z-axis 152. In some examples, magnetic device 120 may include a magnetic tunnel junction (MTJ) element. The MTJ element may include a free structure configured to store the perpendicular magnetization 122, a pinned structure, and a tunnel barrier arranged between the free structure and the pinned structure. Magnetic device 120 may be further configured to determine a parallel magnetization that extends along x-axis 150. In some examples, magnetic device 120 may include one or more MRAMs. For example, magnetic device 120 may include one or more STT-MRAMs.

Magnetic shielding 112, side magnetic shielding elements 110A-110B (collectively, side magnetic shielding elements 110 or simply magnetic shielding 110) may include a magnetic material. Examples of a magnetic materials and alloys may include, one or more of nickel iron, nickel iron molybdenum, nickel iron with chromium, or other materials with additional material constituents. For example, side magnetic shielding elements 110 may include (e.g., be formed of) a first magnetic material and magnetic shielding 112 may include a second magnetic material that is the same or different from the first magnetic material. Side magnetic shielding elements 110 may include a third magnetic material that may be the same as one or more of the first material or the second material. In some examples, the third magnetic material may be different from the first material and the second material.

As shown in FIG. 1A, magnetic shielding 112 may extend over a top surface 170 of magnetic device 120 at least partially between a first side surface 174 of magnetic device 120 and a second side surface 176 of magnetic device 120. As shown, top surface 170 may be on an opposite side of magnetic device 120 from bottom surface 172 of magnetic device 120. Magnetic shielding 116 may extend over a bottom surface 172 of magnetic device 120 at least partially between a first side surface 174 of magnetic device 120 and a second side surface 176 of magnetic device 120.

Side magnetic shielding elements 110 may each extend at least partially between top surface 170 of magnetic device 120 and bottom surface 172 of magnetic device 120. In this way, side magnetic shielding elements 110 may help to shunt magnetization fields from an environment. In some examples, side magnetic shielding elements 110 forms a void of the third magnetic material that exposes first side surface 174. For instance, side magnetic shielding elements 110A, 110C may form a void 180 exposing first side surface 174. Side magnetic shielding elements 110 may form a void 180 exposing second side surface 176. For instance, side magnetic shielding elements 110B, 110D may form a void 182 exposing second side surface 176. In some examples, a structure material may be formed in void 180 and/or void 182. For instance, the structure material may separate side magnetic shielding element 110A and side magnetic shielding element 110C. Similarly, the structure material may separate side magnetic shielding element 110B and side magnetic shielding element 110D. The structure material may include a conductive material. In some examples, the structure material may include a non-conductive material. The structure material may be non-magnetic.

One or more of magnetic shielding 112, magnetic shielding 116, or side magnetic shielding elements 1120 may be coupled to a ground of magnetic device 120. Side magnetic shielding elements 110 may be coupled to an electrical ground, also referred to herein as simply "ground," of magnetic device 120.

Figure 1B:
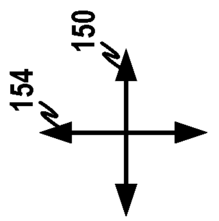
FIG. 1B shows a conceptual illustration of the magnetic shielding of FIG. 1A in a two-dimensional x-y plane view, in accordance with the techniques of the disclosure.

In the example of FIGS. 1A, 1B, magnetic shielding 112 and magnetic shielding 116 are rectangular. However, in other examples, magnetic shielding 112 and magnetic shielding 116 may form different shapes. As shown in FIG. 1B, a first side magnetic shielding element 110A may be arranged at a first corner (e.g., an lower left corner) of magnetic shielding 112, a second side magnetic shielding element 110B may be arranged at a second corner (e.g., a lower right corner) of magnetic shielding 112, a third side magnetic shielding element 110C may be arranged at a third corner (e.g., an upper left corner) of magnetic shielding 112 and a fourth side magnetic shielding element 110D may be arranged at a fourth corner (e.g., an upper right corner) of magnetic shielding 112.

Figure 1B:
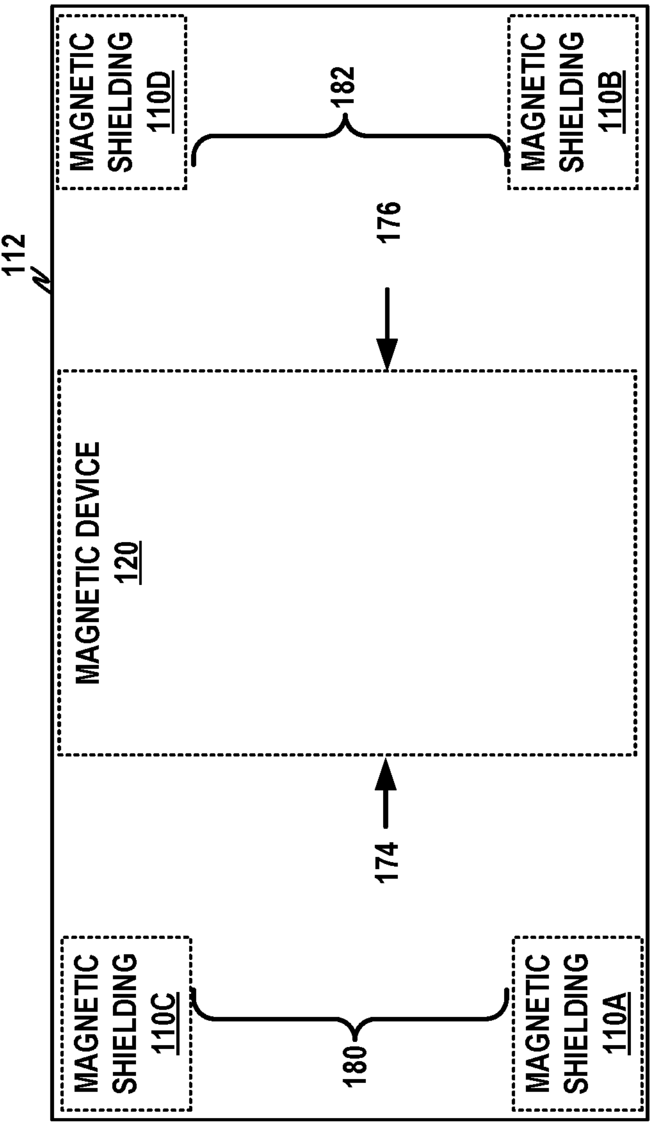

In the example of FIGS. 1A, 1, each one of side magnetic shielding elements 110 may extend below a bottom surface 111 of magnetic shielding 112. In this example, each one of side magnetic shielding elements 110 may extend over (e.g., spaced apart from or adjacent to) a first side surface 119 of magnetic shielding 116 or a second side surface 121 of magnetic shielding 116. As used herein, magnetic shielding elements 110 may be spaced apart from magnetic shielding 112 and/or magnetic shielding 116 using, for example, an adhesive, air, or a material providing a fixed separation. For example, the material providing the fixed separation may be placed between magnetic shielding elements 110 and magnetic shielding 112 and may include one or more of an insulating material, a conductive material, or a magnetically permeable material. As shown, first side surface 119 of magnetic shielding 116 may be on an opposite side of magnetic shielding 116 from second side surface 121 of magnetic shielding 116.

Magnetic shielding 112, which may be referred to herein as a "second magnetic shielding," may include a magnetic material. As shown in FIG. 1A, magnetic shielding 112 (e.g., second magnetic material of magnetic shielding 112) may extend at least partially between a first side surface 174 of magnetic device 120 and a second side surface 176 of magnetic device 120 in x-axis 150. Second magnetic shielding 112 (e.g., second magnetic material of magnetic shielding 112) may extend at least a second distance extending between first side surface 174 of magnetic device 120 and second side surface 176 of magnetic device 120 in x-axis 150. As shown, first side surface 174 may be on an opposite side of magnetic device 120 from second side surface 176 of magnetic device 120. In some examples, magnetic shielding 112 may be spaced apart magnetic device 120 along z-axis 152. In the example of FIG. 1A, magnetic shielding 112 may be opposite from top surface 170 of magnetic device 120 along z-axis 152. In some examples, however, magnetic shielding 112 be opposite from bottom surface 172 of magnetic device 120 along z-axis 152. Magnetic shielding 112 may be coupled to an electrical ground, also referred to herein as simply "ground," of magnetic device 120.

In accordance with one or more techniques described herein, magnetic shielding 110, 112, 116 may be configured to shunt both in-plane and out-of-plane magnetization fields from an environment. For example, side magnetic shielding elements 110 may help to shunt a magnetic field that is out-of-plane. Similarly, magnetic shielding 112 and/or magnetic shielding 116 may help to shunt a magnetic field that is in-plane. Applying magnetic shielding (e.g., magnetic shielding for perpendicularly-oriented magnetic structures) can enable magnetic device 120 to determine a perpendicular magnetization 122 with minimal or no interference from both in-plane and out-of-plane magnetization fields from an environment, which may help to achieve a higher memory density, lower power, and/or lower cost per bit compared to devices that only shield for in-plane magnetization fields from the environment.

FIG. 1B shows a conceptual illustration of the magnetic shielding of magnetic device 120 of FIG. 1A in a two-dimensional x-y plane view, in accordance with the techniques of the disclosure. FIG. 1B is shown with reference to x-axis 150 and y-axis 154. Dimensions and ratios illustrated in FIG. 1B are for example purposes only. As shown, magnetic device 120 may be below magnetic shielding 112, as indicated by the dashed lines.

Figure 2A:
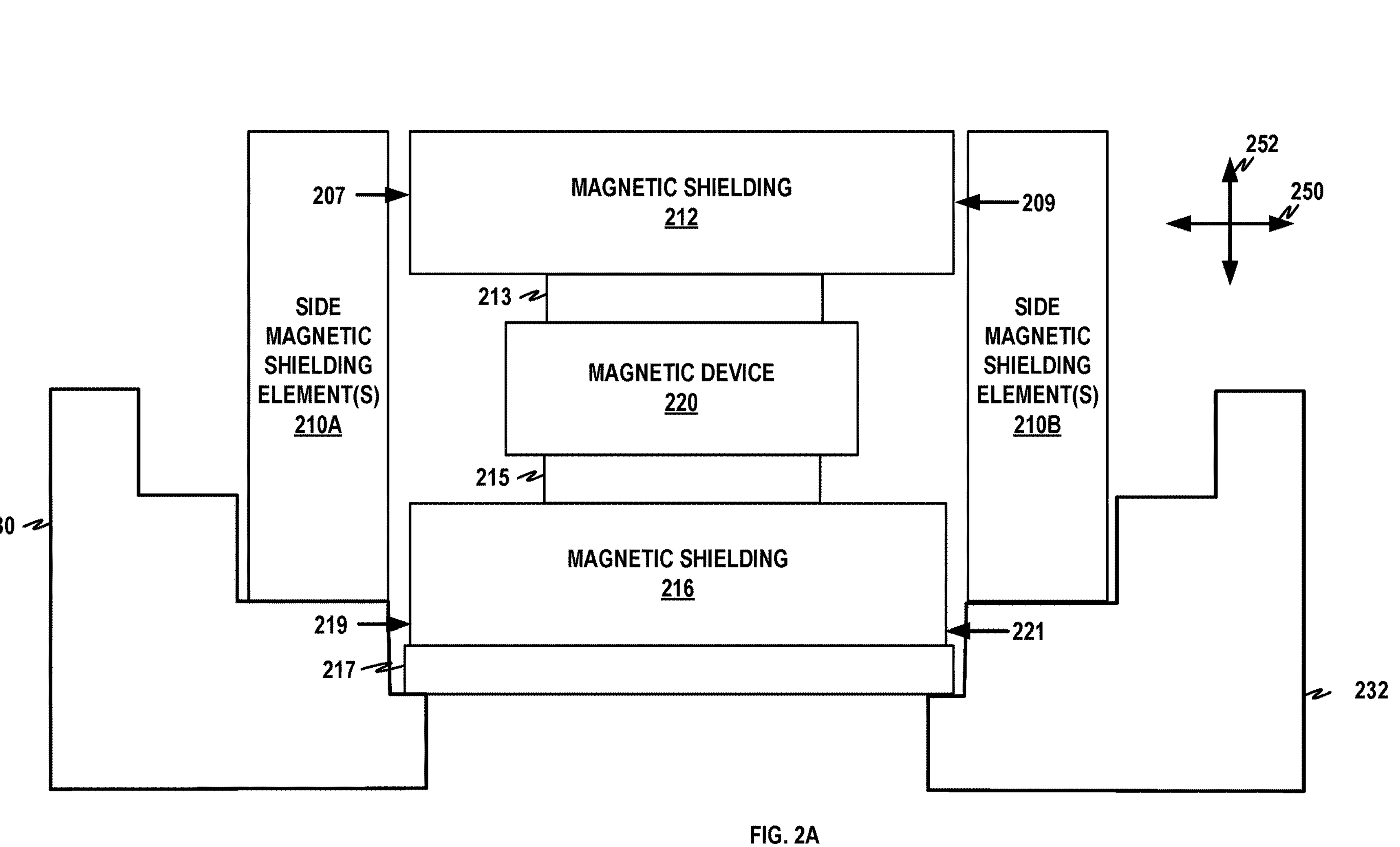
FIG. 2A shows a conceptual illustration of a second example of magnetic shielding of a magnetic device in a two-dimensional x-z plane view, in accordance with the techniques of the disclosure.
Figure 2B:
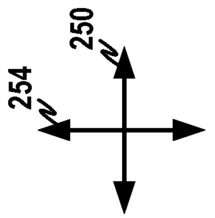
FIG. 2B shows a conceptual illustration of the magnetic shielding of FIG. 2A in a two-dimensional x-y plane view, in accordance with the techniques of the disclosure.

FIG. 2A shows a conceptual illustration of a second example of magnetic shielding of a magnetic device 220 in a two-dimensional x-z plane view, in accordance with the techniques of the disclosure. FIG. 2A is shown with reference to x-axis 250 and z-axis 252. In the example of FIGS. 2A and 2B, an apparatus 200 may include magnetic shielding 212, which is also referred to herein as "top magnetic shielding," magnetic shielding 216, which is also referred to herein as "bottom magnetic shielding", side magnetic shielding elements 210A-210B (collectively, side magnetic shielding elements 210, also referred to herein as a plurality of side magnetic shielding elements 210 or simply magnetic shielding 210) and a magnetic device 220. In the example of FIG. 2A, apparatus 200 may optionally include one or more of preform 213, preform 215, lid seal ring 230, or lid seal ring 232.

In the example FIGS. 2A, 2B, at least one of side magnetic shielding elements 210 may extend over a side surface of magnetic shielding 212. For example, side magnetic shielding element 210A extends over first side surface 207 of magnetic shielding 212. In some examples, side magnetic shielding element 210B extends over second side surface 209 of magnetic shielding 212. As shown, first side surface 207 of magnetic shielding 212 is on an opposite side of magnetic shielding 212 from second side surface 209 of magnetic shielding 212. In the example of FIGS. 2A, 2B each one side magnetic shielding elements 210 is spaced apart from side surfaces of magnetic shielding 212. For instance, side magnetic shielding element 210A is spaced apart from first side surface 207 of magnetic shielding 212 and side magnetic shielding element 210B is spaced apart from second side surface 209 of magnetic shielding 212.

Similarly, at least one of side magnetic shielding elements 210 may extend over a side surface of magnetic shielding 216. For example, side magnetic shielding element 210A extends over first side surface 219 of magnetic shielding 216. In some examples, side magnetic shielding element 210B extends over second side surface 221 of magnetic shielding 216. As shown, first side surface 219 of magnetic shielding 212 is on an opposite side of magnetic shielding 216 from second side surface 221 of magnetic shielding 216.

Magnetic shielding elements 210 may be spaced apart from magnetic shielding 212 and/or magnetic shielding 216 using, for example, an adhesive, air, or a material providing a fixed separation. For example, the material providing the fixed separation may be placed between magnetic shielding elements 210 and magnetic shielding 212 and may include one or more of an insulating material, a conductive material, or a magnetically permeable material.

FIG. 2B shows a conceptual illustration of the magnetic shielding of magnetic device 120 of FIG. 1A in a two-dimensional x-y plane view, in accordance with the techniques of the disclosure. FIG. 2B is shown with reference to x-axis 250 and y-axis 254. Dimensions and ratios illustrated in FIG. 1B are for example purposes only. As shown, magnetic device 120 may be below magnetic shielding 112, as indicated by the dashed lines.

Figure 3A:
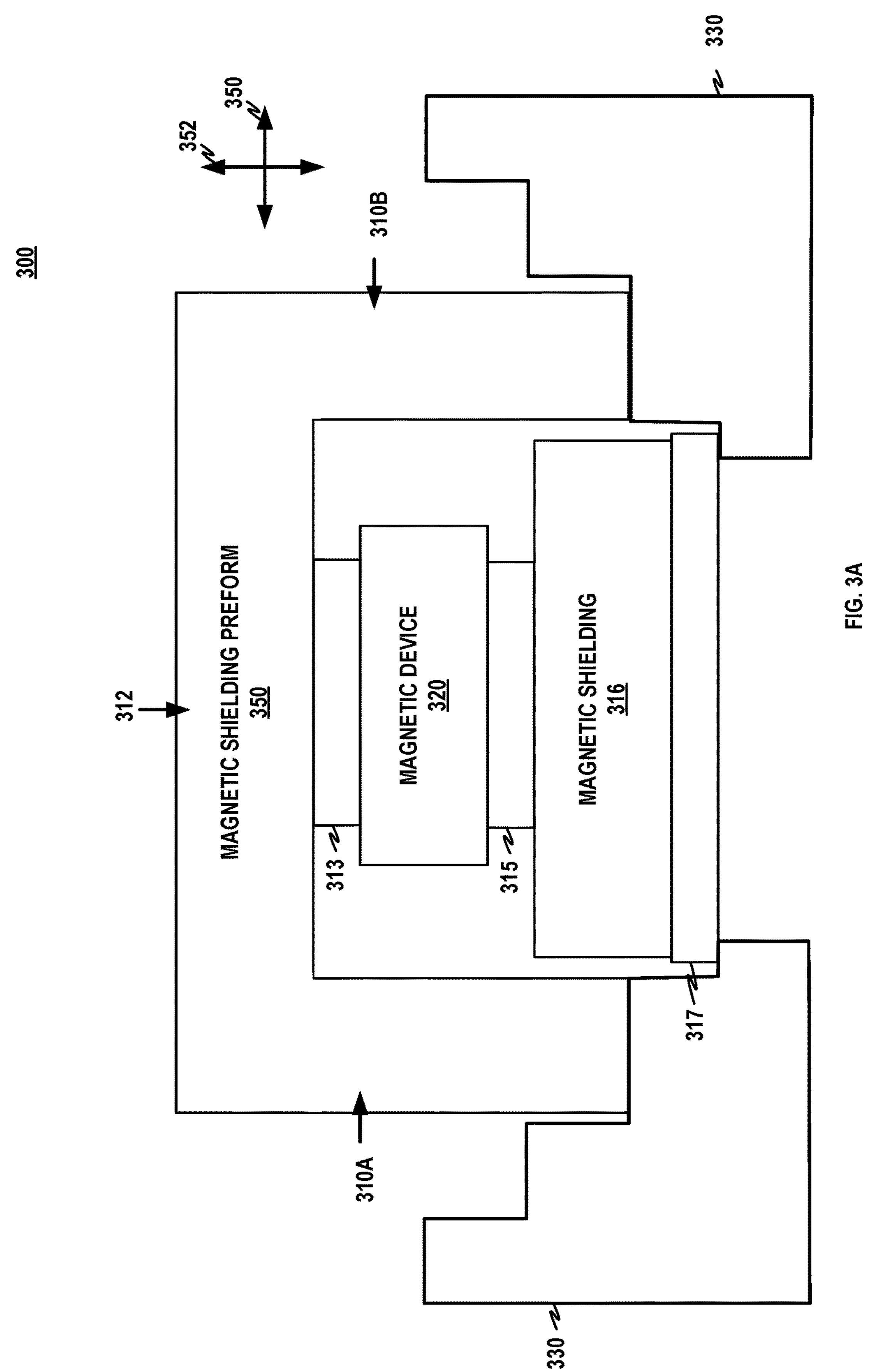
FIG. 3A shows a conceptual illustration of a third example of magnetic shielding of a magnetic device in a two-dimensional x-z plane view, in accordance with the techniques of the disclosure.
Figure 3B:
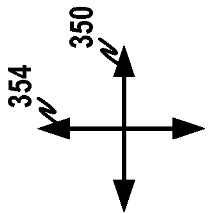
FIG. 3B shows a conceptual illustration of the magnetic shielding of FIG. 3A in a two-dimensional x-y plane view, in accordance with the techniques of the disclosure.

FIG. 3A shows a conceptual illustration of a third example of magnetic shielding of a magnetic device 320 in a two-dimensional x-z plane view, in accordance with the techniques of the disclosure. In the example of FIGS. 3A, 3B, an apparatus 300 may include magnetic shielding 312, which is also referred to herein as "top magnetic shielding," magnetic shielding 316, which is also referred to herein as "bottom magnetic shielding", side magnetic shielding elements 310A-310B (collectively, side magnetic shielding elements 310, also referred to herein as a plurality of side magnetic shielding elements 310 or simply magnetic shielding 310) and a magnetic device 320. In the example of FIG. 3A, apparatus 300 may optionally include one or more of preform 313, preform 315, lid seal ring 330, or lid seal ring 332. In the example FIGS. 3A, 3B, magnetic shielding elements 310 and magnetic shielding 312 form a preform.

Magnetic shielding elements 310 may be spaced apart from magnetic shielding 316 using, for example, an adhesive, air, or a material providing a fixed separation. For example, the material providing the fixed separation may be placed between magnetic shielding elements 310 and magnetic shielding 316 and may include one or more of an insulating material, a conductive material, or a magnetically permeable material.

FIG. 3B shows a conceptual illustration of the magnetic shielding of magnetic device 120 of FIG. 1A in a two-dimensional x-y plane view, in accordance with the techniques of the disclosure. FIG. 3B is shown with reference to x-axis 350 and y-axis 354. Dimensions and ratios illustrated in FIG. 1B are for example purposes only. As shown, magnetic device 120 may be below magnetic shielding 312, as indicated by the dashed lines.

Figure 4:
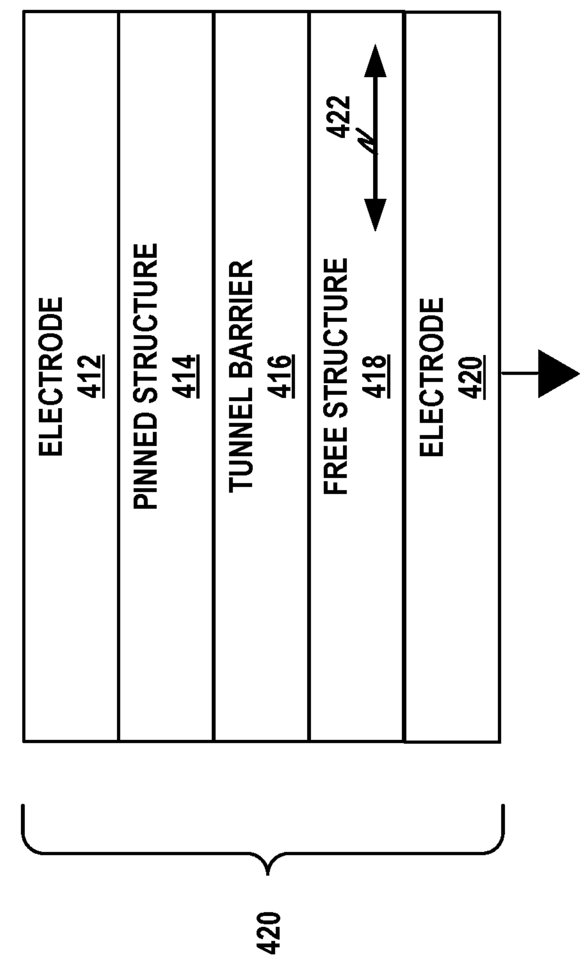
FIG. 4 shows a conceptual illustration of an example of a magnetic tunnel junction (MTJ) element, in accordance with the techniques of the disclosure.

FIG. 4 shows a conceptual illustration of an example of a MTJ element 424, in accordance with the techniques of the disclosure. MTJ element 424 includes free structure 404, tunnel barrier 408, and a pinned structure 410. Free structure 404 may include multiple free layers. Free structure 404 may include a magnetization direction that is free to switch between a parallel orientation and an antiparallel orientation. Tunnel barrier 408 includes a non-magnetic metal that separates free structure 404 and pinned structure 710. In some examples, tunnel barrier 408 may be formed of aluminum oxide, magnesium oxide, or another material. Pinned structure 410 may include a magnetization direction that is fixed or "pinned" to a single orientation. For example, pinned structure 410 may be pinned in a parallel orientation. In other examples, pinned structure 410 may be pinned in an antiparallel orientation. In the example of FIG. 4, pinned structure 410 may include an anti-ferromagnetic layer, such that the magnetization direction of the pinned structure 410 is "pinned" in a particular orientation the magnetization direction of the pinned structure 410 remains relatively fixed when operational magnetic fields are applied to MTJ element 424.

Electrodes 412, 420 may be formed of a conductive material to permit a connection to MTJ element 424. Examples of conductive materials may include, but are not limited to, copper. As shown, in this example, tunnel barrier 408 may be arranged below free structure 404. A geometry of tunnel barrier 408 may be optimized for read endurance without being subject to the write process.

Figure 5:
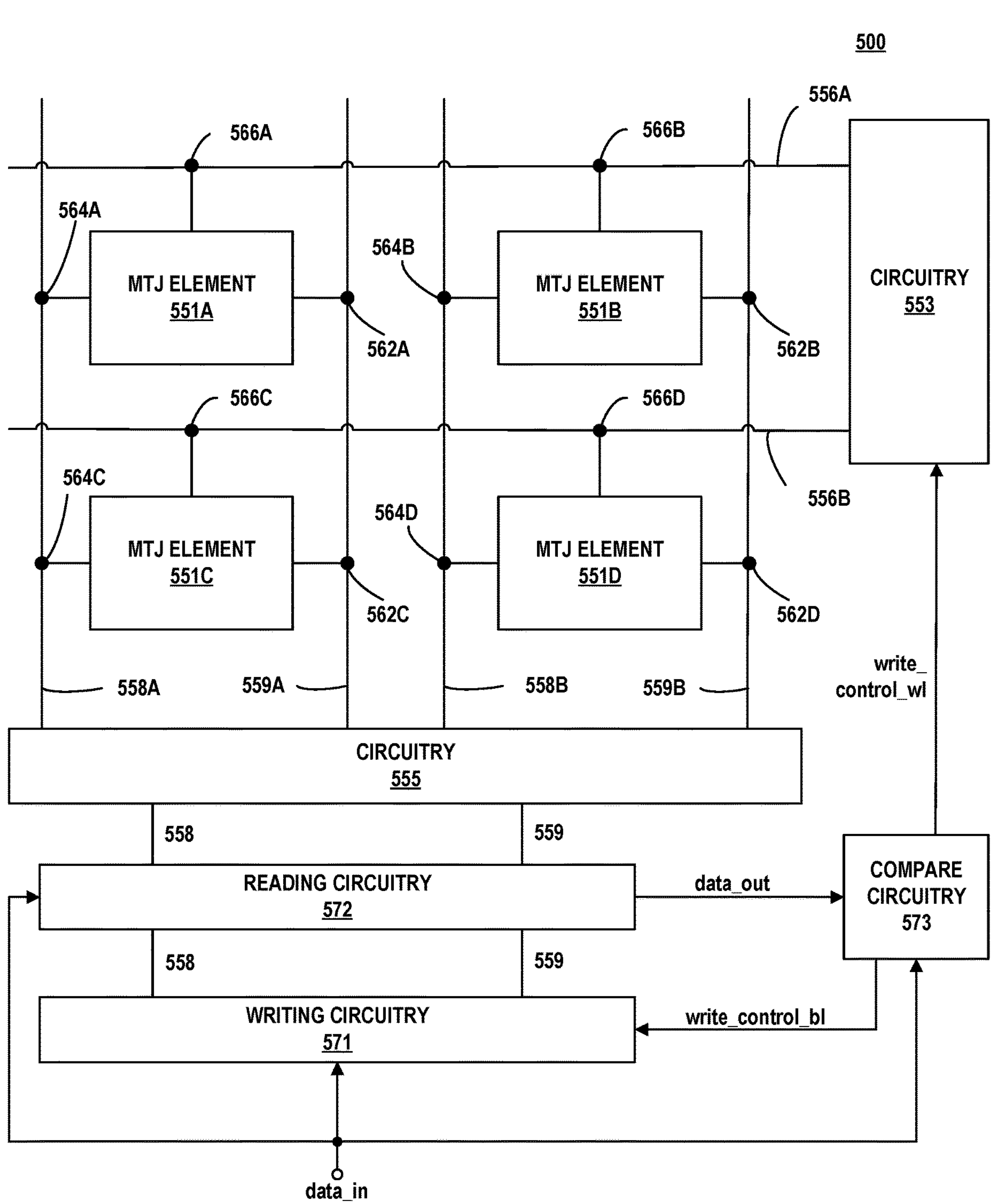
FIG. 5 shows a diagram of a magnetic device that may be used to implement the techniques of the present disclosure, in accordance with the techniques of the disclosure.

FIG. 5 shows a diagram of a magnetic device 500 that may be used to implement the techniques of the present disclosure. Memory devices implementing one or more of the techniques described in this disclosure may be implemented in a wide array of electronic devices ranging from small portable devices such as music players, smart phones, game cartridges, and memory sticks up to larger devices such as tablet computers, gaming devices or consoles, desktop computers, super computers, and enterprise storage solutions. Processing circuitry may include circuitry 555, reading circuitry 572, writing circuitry 571, compare circuitry 573, and circuitry 553. While the following example refers to an example using MTJ elements, techniques described herein may apply to any magnetic device. For example, techniques described herein may be applied to MRAM, such as, for example, STT-MRAMs.

Bitline 558A connects to MTJ element 551A ("MTJ element") at node 564A and connects to MTJ element 551C at node 564C. Bitline 558B connects to MTJ element 551B at node 564B and connects to MTJ element 551D at node 564D. Although, not explicitly shown in FIG. 5, each of nodes 564A-564D may correspond to a source or drain terminal of an access MOSFET for a respective MTJ element.

Bitline 559A connects to MTJ element 551A at node 562A and connects to MTJ element 551C at node 562C. Bitline 559B connects to MTJ element 551B at node 562B and connects to MTJ element 551D at node 562D. Although, not explicitly shown in FIG. 5, each of nodes 562A-562D may correspond to a source or drain terminal of an access MOSFET of a respective MTJ element. For example, node 564A may correspond to a source or drain terminal of an access MOSFET for MTJ element 551A and node 562A may correspond to a source or drain terminal of an access MOSFET for MTJ element 551A.

By controlling the voltages applied to wordline 556A, wordline 556B, bitline 558A, bitline 558B, bitline 559A, and bitline 559B, an individual MTJ element can be addressed. For example, suppose that a write operation is being performed on MTJ element 551A. Circuitry 553 may apply an access MOSFET turn-on voltage to wordline 556A and a turn-off voltage to wordline 556B, and circuitry 555 may pass a high voltage to bitline 559A but not to bitline 559B. In this case, the turn-on voltage applied to wordline 556A causes node 566A (connected to a gate of an access MOSFET, not shown in FIG. 5) to receive a turn-on voltage. The high voltage applied to bitline 559A causes node 562A (connected to a source or drain of an access MOSFET, not shown in FIG. 5) to receive a high voltage, and a source voltage applied to bitline 558A causes node 564A (connected to a source or drain of an access MOSFET) to receive a source voltage. As described above, the high voltage applied to node 566A causes current to flow through an access MOSFET, resulting in current through MTJ element 551A. Thus, the resistance and/or magnetoresistance of MTJ element 551A can be changed. Examples of resistance and/or magnetoresistance may include, but are not limited to, tunnel magnetoresistance (TMR), giant magnetoresistance (GMR), anisotropic magnetoresistive (ARM), and other resistance and/or magnetoresistance.

While this write operation is occurring at MTJ element 551A, it is intended that MTJ elements 551B, 551C, and 551D remain unchanged. Although the high voltage applied to wordline 556A can cause a high voltage at node 566B (connected to a gate of an access MOSFET for MTJ element 551B), circuitry 555 may not apply a high voltage to either bitline 558B or bitline 559B. In this case, with no high voltage drop across an access MOSFET for MTJ element 551B, the state of MTJ element 551B does not change.

Similarly, while this write operation is occurring at MTJ element 551A, the high voltage applied to bitline 559A causes a high voltage at node 562C, and the source voltage applied to bitline 558A causes a source voltage at node 564C. Circuitry 553, however, applies a turn-off voltage to wordline 556B. Thus, the access MOSFET of MTJ element 551C does not conduct current, and thus it is intended that this prevents current at MTJ element 551C. Without a current flow, the resistance of MTJ element 551C does not change, and the state of MTJ element 551C does not change. Accordingly, by controlling the voltages applied to wordline 556A, wordline 556B, bitline 558A, bitline 558B, bitline 559A, and bitline 559B, in the manner described above, MTJ elements 551A, 551B, 551C, and 551D can be individually written to without altering the state of MTJ elements that are connected to a common wordline or common bitline.

Writing circuitry 571 receives data input (e.g., '0' or '1'), which represents a state of two states. Depending on the data state to be written, writing circuitry 571 defines the appropriate voltage to be applied to the bitlines. As discussed above, circuitry 555 controls the passing of the voltages from writing circuitry 571 output bitline 558 and bitline 559 to the various bitlines so that the write operation is applied to the correct MTJ element within the array of MTJ elements.

Reading circuitry 572 is configured to monitor the resistance and/or magnetoresistance of a given MTJ element, which may correspond to a spin-dependent diffusion, spin-orbit coupling, and spin transfer of the given MTJ element, while the given MTJ element is undergoing a write operation. This monitoring of the resistance and/or magnetoresistance is termed Rmonitor, which represents the real time measuring of the MTJ element resistance and/or magnetoresistance during the write operation. Reading circuitry 572 uses the write "0" or "1" states defined on data_in to determine which monitoring state and Rwrite_ref to set up.

Compare circuitry 573 compares the "0" or "1" data state of the selected MTJ element of MTJ elements 551A-551D, as determined by reading circuitry 572 and defined on node data_out, to the "0" or "1" data state as defined on node data_in and issues a write terminate instruction on the write_control_bl and write_control_wl lines upon determining that the data states on data_in and data_out match.

When circuitry 573 issues a write terminate command on write_control_bl to writing circuitry 571, writing circuitry 571 terminates the application of the high voltage on bitline 558 or bitline 559 which causes the high voltage across the selected MTJ element to collapse and, thus, stop the resistance and/or magnetoresistance changing and stop modifying spin-dependent diffusion, spin-orbit coupling, and spin transfer of the MTJ element. When circuitry 573 issues a write terminate command on write_control_wl to circuitry 553, circuitry 553 changes the turned-on wordline to turned-off which causes the selected MTJ element to collapse and, thus, stop the resistance and/or magnetoresistance changing in the MTJ element.

In accordance with one or more techniques described herein, writing circuitry 571 is configured to receive an instruction to set an MTJ element to a target state of a plurality of states. For example, writing circuitry 571 may be configured to receive an instruction to set MTJ element 551A to a state '1'. In response to receiving the instruction, writing circuitry 571 may be configured to generate electrical current to modify a resistance of the MTJ element to correspond to the target state. For example, writing circuitry 571 may be configured to define the appropriate voltage to be applied to the bitlines. In this example, circuitry 555 controls the passing of voltages from writing circuitry 571 output bitline 558 and bitline 559 to the various bitlines such that the write operation is applied to the correct MTJ element within the array of MTJ elements. For instance, writing circuitry 571 generates electrical current through MTJ element 551 to set MTJ element 551 to a state '1'.

Figure 6:
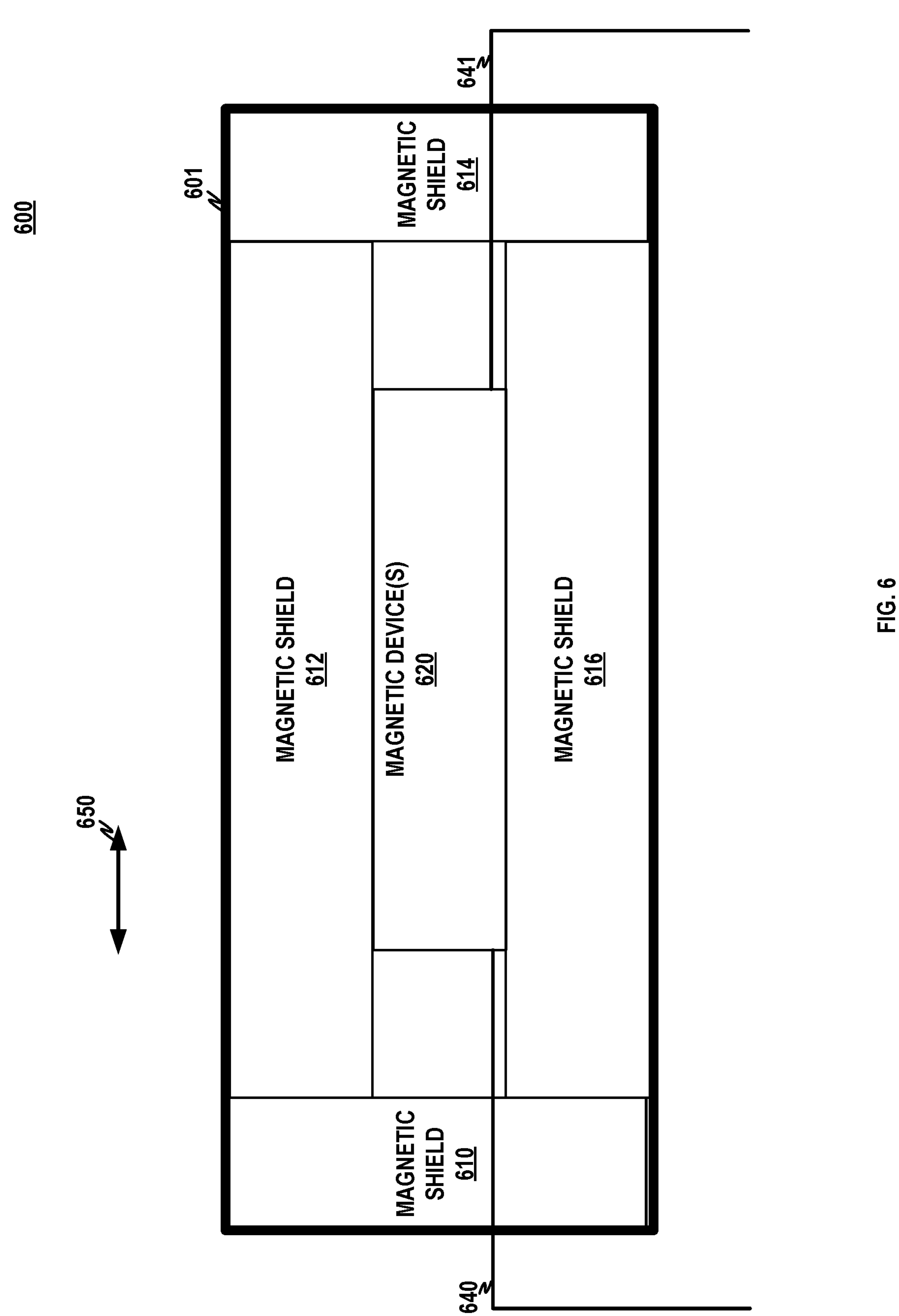
FIG. 6 shows a conceptual illustration of an example of a chip package, in accordance with the techniques of the disclosure

FIG. 6 shows a conceptual illustration of an example of a chip package 600, in accordance with the techniques of the disclosure. As shown, chip package 600 may include magnetic shields 610-616. However, in some examples, one or more magnetic shields of magnetic shields 610-616 may be omitted. Any combination of magnetic shields 610-616 may be coupled to an electrical ground, also referred to herein as simply "ground," of magnetic device 620.

Chip package 600 may include an integrated circuit formed in a die 601. Chip package 600 may comprise semiconductor chips. For example, magnetic device(s) 620, also referred to herein as simply "magnetic device 620," may be formed using a chip package comprising a single chip. In some examples, magnetic device 620 may be formed using a chip package comprising multi-chip module. As shown, one or more of magnetic shields 610-616 may be formed in the die 601. In some examples, one or more of magnetic shields 610-616 may be formed in chip package 600. One or more of magnetic shields 610-616 may be formed externally from chip package 600.

In this example, chip package 600 may comprise one or more pins 640-641. For example, pin 640 may be electrically coupled to magnetic device 620 and extending from magnetic device 620 along the x-axis 650 and completely through magnetic shield 610. In some examples, pin 641 may be electrically coupled to magnetic device 620 and extending from magnetic device 620 along the x-axis 650 and completely through magnetic shield 614. In this way, pins for magnetic device 620 may extend through "sides" of chip package. For instance, magnetic shield 610 may comprise a plurality of patterned structures (e.g., columnar structures) formed of magnetic material and pin 640 may extend between a first structure of the plurality of patterned structures and a second structure of the plurality of patterned structures. Similarly, magnetic shield 614 may comprise a plurality of patterned structures (e.g., columnar structures) formed of magnetic material and pin 640 may extend between a first structure of the plurality of patterned structures and a second structure of the plurality of patterned structures.

Figure 7:
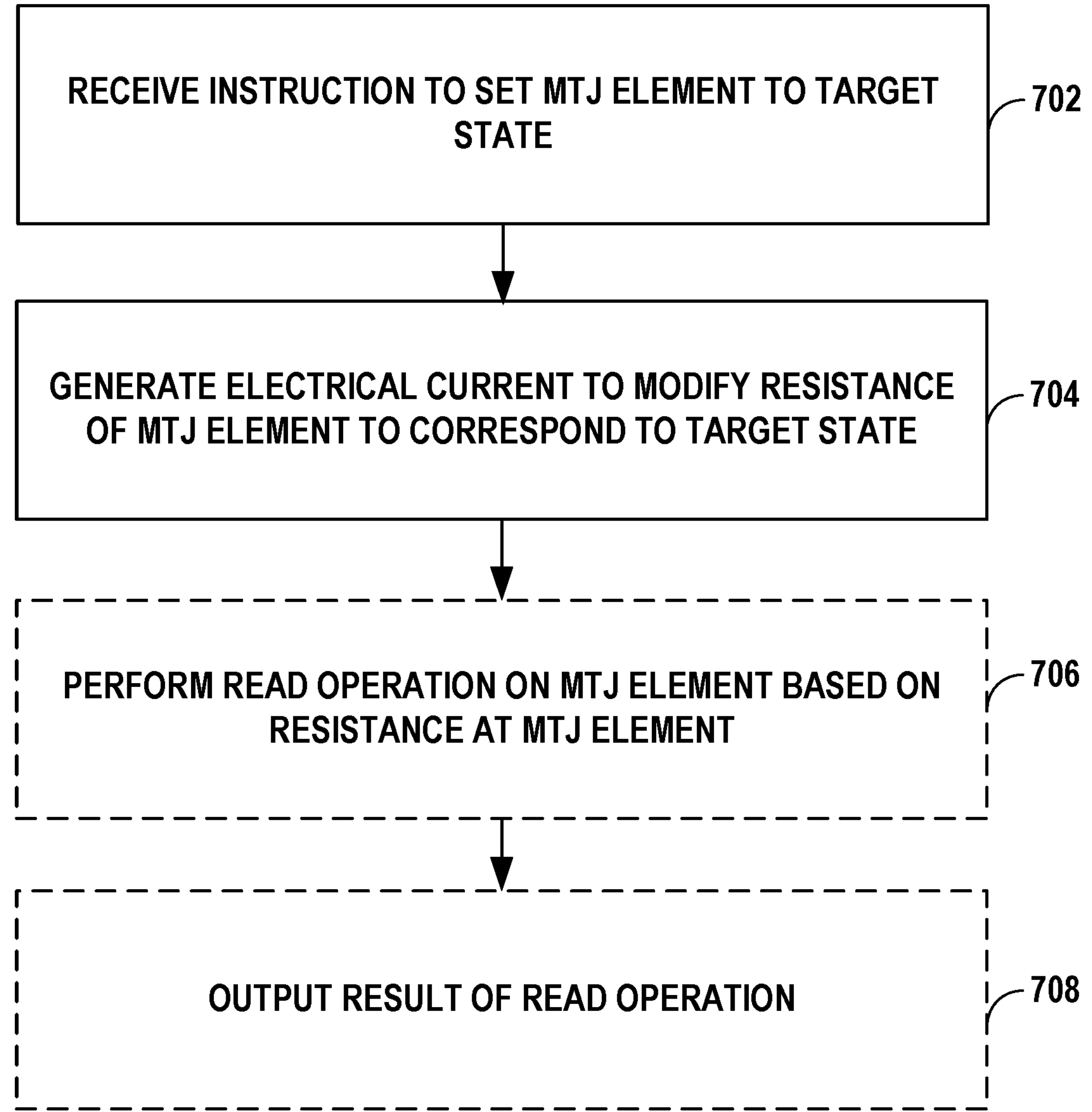
FIG. 7 shows a flowchart of a process for performing a write operation, in accordance with the techniques of this disclosure.

FIG. 7 shows a flowchart of a process for performing a write operation, in accordance with the techniques of this disclosure. The techniques of FIG. 7 may, for example, be performed by magnetic device described above with respect to any combination of FIGS. 1-6. While the following example refers to an example using MTJ elements, techniques described herein may apply to any magnetic device. For example, techniques described herein may be applied to MRAM, such as, for example, STT-MRAMs.

Processing circuitry receives an instruction to set a MTJ element of a magnetic device to a target state of a plurality of states (702). For example, processing circuitry receives an instruction to set a MTJ element to a high logical value "1." The processing circuitry may generate electrical current to modify a resistance of the MTJ element to correspond to the target state (704). For example, the processing circuitry may generate electrical current to modify a spin-dependent diffusion, spin-orbit coupling, and spin transfer of MTJ element 124 to a resistance that corresponds to the high logical value "1."

The processing circuitry may optionally perform a read operation on MTJ element based on a resistance at MTJ element (706). For example, the processing circuitry may determines the MTJ element has a state of the high logical value "1" when a resistance of the MTJ element corresponds to the high logical value "1." The processing circuitry may optionally output an indication of the read operation (708). For example, the processing circuitry may output a high logical value "1" in response to the read operation on the MTJ element.

The following numbered clauses may demonstrate one or more aspects of the disclosure.

Clause 1. An apparatus comprising: a magnetic device; top magnetic shielding comprising a first magnetic material, the top magnetic shielding extending over a top surface of the magnetic device at least partially between a first side surface of the magnetic device and a second side surface of the magnetic device, wherein the first side surface is on an opposite side of the magnetic device from the second side surface of the magnetic device; bottom magnetic shielding comprising a second magnetic material, the bottom magnetic shielding extending over a bottom surface of the magnetic device at least partially between the first side surface of the magnetic device and the second side surface of the magnetic device; and a plurality of side magnetic shielding elements, each side magnetic shielding element of the plurality of side magnetic shielding elements comprising a third magnetic material, each one of the plurality of side magnetic shielding elements extending at least partially between the top surface of the magnetic device and the bottom surface of the magnetic device, wherein the plurality of side magnetic shielding elements forms a void of the third magnetic material that exposes the first side surface.

Clause 2. The apparatus of clause 1, wherein the top magnetic shielding and the bottom magnetic shielding are rectangular; and wherein the plurality of side magnetic shielding elements comprises: a first side magnetic shielding element arranged at a first corner of the top magnetic shielding; a second side magnetic shielding element arranged at a second corner of the top magnetic shielding; a third side magnetic shielding element arranged at a third corner of the top magnetic shielding; and a fourth side magnetic shielding element arranged at a fourth corner of the top magnetic shielding.

Clause 3. The apparatus of clauses 1-2, wherein each one of the plurality of side magnetic shielding elements extends below a bottom surface of the top magnetic shielding.

Clause 4. The apparatus of clause 3, wherein each one of the plurality of side magnetic shielding elements extends over a first side surface of the bottom magnetic shielding or a second side surface of the bottom magnetic shielding, wherein the first side surface of the bottom magnetic shielding is on an opposite side of the bottom magnetic shielding from the second side surface of the bottom magnetic shielding.

Clause 5. The apparatus of clauses 1-2, wherein at least one of the plurality of side magnetic shielding elements extends over a side surface of the top magnetic shielding.

Clause 6. The apparatus of clause 5, wherein at least one of the plurality of side magnetic shielding elements extends over a side surface of the bottom magnetic shielding.

Clause 7. The apparatus of clause 1 or 5, wherein each one of the plurality of side magnetic shielding elements is spaced apart from side surfaces of the top magnetic shielding.

Clause 8. The apparatus of clause 1, wherein each one of the plurality of side magnetic shielding elements and the top magnetic shielding form a preform.

Clause 9. The apparatus of clauses 1-8, wherein the magnetic device comprises a magnetic tunnel junction (MTJ) element, the MTJ element comprising a free structure configured to store a perpendicular magnetization that extends along a z-axis, a pinned structure, and a tunnel barrier arranged between the free structure and the pinned structure; and wherein the magnetic device is further configured to determine a parallel magnetization that extends along an x-axis that is perpendicular to the z-axis.

Clause 10. The apparatus of clauses 1-9, wherein the magnetic device comprises magneto-resistive random access memories (MRAMs).

Clause 11. The apparatus of clause 10, wherein the magnetic device comprises one or more of a spin-torque transfer MRAM (STT-MRAM) or a magnetic tunnel junction (MTJ) element.

Clause 12. The apparatus of clauses 1-11, wherein a structure material separates a first side magnetic shielding element of the plurality of side magnetic shielding elements and a second side magnetic shielding element of the plurality of side magnetic shielding elements.

Clause 13. The apparatus of clause 12, wherein the structure material comprises a conductive material.

Clause 14. The apparatus of clause 12, wherein the structure material comprises a non-conductive material.

Clause 15. The apparatus of clauses 1-14, wherein the top magnetic shielding, the bottom magnetic shielding, and each of the plurality of side magnetic shielding elements are coupled to a ground of the magnetic device.

Clause 16. The apparatus of clauses 1-15, wherein the apparatus forms a chip package comprising one or more semiconductor chips.

Clause 17. A chip package comprising: a magnetic device; top magnetic shielding comprising a first magnetic material, the top magnetic shielding extending over a top surface of the magnetic device at least partially between a first side surface of the magnetic device and a second side surface of the magnetic device, wherein the first side surface is on an opposite side of the magnetic device from the second side surface of the magnetic device; bottom magnetic shielding comprising a second magnetic material, the bottom magnetic shielding extending over a bottom surface of the magnetic device at least partially between the first side surface of the magnetic device and the second side surface of the magnetic device; a plurality of side magnetic shielding elements, each side magnetic shielding element comprising a third magnetic material, each one of the plurality of side magnetic shielding elements extending at least partially between the top surface of the magnetic device and the bottom surface of the magnetic device, wherein the plurality of side magnetic shielding elements forms a void of the third magnetic material that exposes the first side surface; and one or more pins, each pin of the one or more pins being electrically coupled to the magnetic device and extending from a third side surface of the magnetic device and/or a fourth side surface of the magnetic device, wherein the third side surface is on an opposite side of the magnetic device from the fourth side surface of the magnetic device.

Clause 18. The chip package of clause 17, wherein the top magnetic shielding and the bottom magnetic shielding are rectangular; and wherein the plurality of side magnetic shielding elements comprises: a first side magnetic shielding element arranged at a first corner of the top magnetic shielding; a second side magnetic shielding element arranged at a second corner of the top magnetic shielding; a third side magnetic shielding element arranged at a third corner of the top magnetic shielding; and a fourth side magnetic shielding element arranged at a fourth corner of the top magnetic shielding.

Clause 19. The chip package of clauses 17-18, wherein each one of the plurality of side magnetic shielding elements extends below a bottom surface of the top magnetic shielding.

Clause 20. An apparatus comprising: a magnetic device comprising magneto-resistive random access memories (MRAMs), each MRAM of the MRAMs being configured to store data based on a perpendicular magnetization; top magnetic shielding comprising a first magnetic material, the top magnetic shielding extending over a top surface of the magnetic device at least partially between a first side surface of the magnetic device and a second side surface of the magnetic device, wherein the first side surface is on an opposite side of the magnetic device from the second side surface of the magnetic device; bottom magnetic shielding comprising a second magnetic material, the bottom magnetic shielding extending over a bottom surface of the magnetic device at least partially between the first side surface of the magnetic device and the second side surface of the magnetic device; and a plurality of side magnetic shielding elements, each side magnetic shielding element comprising a third magnetic material, each one of the plurality of side magnetic shielding elements extending at least partially between the top surface of the magnetic device and the bottom surface of the magnetic device, wherein the plurality of side magnetic shielding elements forms a void of the third magnetic material that exposes the first side surface.

The processing circuitry may include metallization and/or integrated circuitry (e.g., Complementary metal-oxide-semiconductor (CMOS)). The processing circuitry may include an analog circuit. In some examples, the processing circuitry may include a microcontroller on a single integrated circuit containing a processor core, memory, inputs, and outputs. For example, the processing circuitry may include one or more processors, including one or more microprocessors, Digital Signal Processors (DSPs), ASICS, Field Programmable Gate Arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. In some examples, processing circuitry may include a combination of one or more analog components and one or more digital components.

The term "circuitry" as used herein may refer to any of the foregoing structure or any other structure suitable for processing program code and/or data or otherwise implementing the techniques described herein. Circuitry may, for example, include any of a variety of types of solid state circuit elements, such as CPUs, CPU cores, GPUs, DSPs, ASICs, mixed-signal integrated circuits, FPGAs, microcontrollers, programmable logic controllers (PLCs), programmable logic device (PLDs), complex PLDs (CPLDs), systems on a chip (SoC), any subsection of any of the above, an interconnected or distributed combination of any of the above, or any other integrated or discrete logic circuitry, or any other type of component or one or more components capable of being configured in accordance with any of the examples disclosed herein.

As used in this disclosure, circuitry may also include one or more memory devices, such as any volatile or non-volatile media, such as a RAM, ROM, non-volatile RAM (NVRAM), electrically erasable programmable ROM (EEPROM), flash memory, and the like. The one or more memory devices may store computer-readable instructions that, when executed or processed the circuitry, cause the circuitry to implement the techniques attributed herein to circuitry. The circuitry of this disclosure may be programmed, or otherwise controlled, with various forms of firmware and/or software.

Various illustrative aspects of the disclosure have been described above. These and other aspects are within the scope of the following claims.

The invention claimed is:

1. An apparatus comprising:

a magnetic device;

top magnetic shielding comprising a first magnetic material, the top magnetic shielding extending over a top surface of the magnetic device at least partially between a first side surface of the magnetic device and a second side surface of the magnetic device, wherein the first side surface is on an opposite side of the magnetic device from the second side surface of the magnetic device;

bottom magnetic shielding comprising a second magnetic material, the bottom magnetic shielding extending over a bottom surface of the magnetic device at least partially between the first side surface of the magnetic device and the second side surface of the magnetic device; and a plurality of side magnetic shielding elements, each side magnetic shielding element of the plurality of side magnetic shielding elements comprising a third magnetic material, each one of the plurality of side magnetic shielding elements extending at least partially between the top surface of the magnetic device and the bottom surface of the magnetic device, wherein the plurality of side magnetic shielding elements forms a void of the third magnetic material that exposes the first side surface.

2. The apparatus of claim 1, wherein the top magnetic shielding and the bottom magnetic shielding are rectangular; and wherein the plurality of side magnetic shielding elements comprises:

a first side magnetic shielding element arranged at a first corner of the top magnetic shielding;

a second side magnetic shielding element arranged at a second corner of the top magnetic shielding;

a third side magnetic shielding element arranged at a third corner of the top magnetic shielding; and a fourth side magnetic shielding element arranged at a fourth corner of the top magnetic shielding.

3. The apparatus of claim 1, wherein each one of the plurality of side magnetic shielding elements extends below a bottom surface of the top magnetic shielding.

4. The apparatus of claim 3, wherein each one of the plurality of side magnetic shielding elements extends over a first side surface of the bottom magnetic shielding or a second side surface of the bottom magnetic shielding, wherein the first side surface of the bottom magnetic shielding is on an opposite side of the bottom magnetic shielding from the second side surface of the bottom magnetic shielding.

5. The apparatus of claim 1, wherein at least one of the plurality of side magnetic shielding elements extends over a side surface of the top magnetic shielding.

6. The apparatus of claim 5, wherein at least one of the plurality of side magnetic shielding elements extends over a side surface of the bottom magnetic shielding.

7. The apparatus of claim 1, wherein each one of the plurality of side magnetic shielding elements is spaced apart from side surfaces of the top magnetic shielding.

8. The apparatus of claim 1, wherein each one of the plurality of side magnetic shielding elements and the top magnetic shielding form a preform.

9. The apparatus of claim 1, wherein the magnetic device comprises a magnetic tunnel junction (MTJ) element, the MTJ element comprising a free structure configured to store a perpendicular magnetization that extends along a z-axis, a pinned structure, and a tunnel barrier arranged between the free structure and the pinned structure; and wherein the magnetic device is further configured to determine a parallel magnetization that extends along an x-axis that is perpendicular to the z-axis.

10. The apparatus of claim 1, wherein the magnetic device comprises magneto-resistive random access memories (MRAMs).

11. The apparatus of claim 10, wherein the magnetic device comprises one or more of a spin-torque transfer MRAM (STT-MRAM) or a magnetic tunnel junction (MTJ) element.

12. The apparatus of claim 1, wherein a structure material separates a first side magnetic shielding element of the plurality of side magnetic shielding elements and a second side magnetic shielding element of the plurality of side magnetic shielding elements.

13. The apparatus of claim 12, wherein the structure material comprises a conductive material.

14. The apparatus of claim 12, wherein the structure material comprises a non-conductive material.

15. The apparatus of claim 1, wherein the top magnetic shielding, the bottom magnetic shielding, and each of the plurality of side magnetic shielding elements are coupled to a ground of the magnetic device.

16. The apparatus of claim 1, wherein the apparatus forms a chip package comprising one or more semiconductor chips.

17. A chip package comprising:

a magnetic device;

top magnetic shielding comprising a first magnetic material, the top magnetic shielding extending over a top surface of the magnetic device at least partially between a first side surface of the magnetic device and a second side surface of the magnetic device, wherein the first side surface is on an opposite side of the magnetic device from the second side surface of the magnetic device;

bottom magnetic shielding comprising a second magnetic material, the bottom magnetic shielding extending over a bottom surface of the magnetic device at least partially between the first side surface of the magnetic device and the second side surface of the magnetic device;

a plurality of side magnetic shielding elements, each side magnetic shielding element comprising a third magnetic material, each one of the plurality of side magnetic shielding elements extending at least partially between the top surface of the magnetic device and the bottom surface of the magnetic device, wherein the plurality of side magnetic shielding elements forms a void of the third magnetic material that exposes the first side surface; and one or more pins, each pin of the one or more pins being electrically coupled to the magnetic device and extending from a third side surface of the magnetic device and/or a fourth side surface of the magnetic device, wherein the third side surface is on an opposite side of the magnetic device from the fourth side surface of the magnetic device.

18. The chip package of claim 17, wherein the top magnetic shielding and the bottom magnetic shielding are rectangular; and wherein the plurality of side magnetic shielding elements comprises:

a first side magnetic shielding element arranged at a first corner of the top magnetic shielding;

a second side magnetic shielding element arranged at a second corner of the top magnetic shielding;

a third side magnetic shielding element arranged at a third corner of the top magnetic shielding; and a fourth side magnetic shielding element arranged at a fourth corner of the top magnetic shielding.

19. The chip package of claim 17, wherein each one of the plurality of side magnetic shielding elements extends below a bottom surface of the top magnetic shielding.

20. An apparatus comprising:

a magnetic device comprising magneto-resistive random access memories (MRAMs), each MRAM of the MRAMs being configured to store data based on a perpendicular magnetization;

top magnetic shielding comprising a first magnetic material, the top magnetic shielding extending over a top surface of the magnetic device at least partially between a first side surface of the magnetic device and a second side surface of the magnetic device, wherein the first side surface is on an opposite side of the magnetic device from the second side surface of the magnetic device;

bottom magnetic shielding comprising a second magnetic material, the bottom magnetic shielding extending over a bottom surface of the magnetic device at least partially between the first side surface of the magnetic device and the second side surface of the magnetic device; and a plurality of side magnetic shielding elements, each side magnetic shielding element comprising a third magnetic material, each one of the plurality of side magnetic shielding elements extending at least partially between the top surface of the magnetic device and the bottom surface of the magnetic device, wherein the plurality of side magnetic shielding elements forms a void of the third magnetic material that exposes the first side surface.

* * * * *